(12) United States Patent
Niemelä et al.

(10) Patent No.: US 12,365,984 B2
(45) Date of Patent: Jul. 22, 2025

(54) TRANSITION METAL DEPOSITION PROCESSES AND DEPOSITION ASSEMBLY

(71) Applicant: ASM IP Holding B.V., Almere (NL)

(72) Inventors: Janne-Petteri Niemelä, Helsinki (FI); Elina Färm, Helsinki (FI); Charles Dezelah, Helsinki (FI); Jan Willem Maes, Wilrijk (BE); Patricio Romero, Wilsele (BE)

(73) Assignee: ASM IP Holding B.V., Almere (NL)

( * ) Notice: Subject to any disclaimer, the term of this patent is extended or adjusted under 35 U.S.C. 154(b) by 28 days.

(21) Appl. No.: 18/390,061

(22) Filed: Dec. 20, 2023

(65) Prior Publication Data

US 2024/0209504 A1 Jun. 27, 2024

Related U.S. Application Data

(60) Provisional application No. 63/434,951, filed on Dec. 23, 2022.

(51) Int. Cl.
*C23C 16/06* (2006.01)
*C23C 16/14* (2006.01)
*C23C 16/455* (2006.01)

(52) U.S. Cl.
CPC ........ *C23C 16/45553* (2013.01); *C23C 16/14* (2013.01)

(58) Field of Classification Search
CPC ... C23C 16/04; C23C 16/45553; C23C 16/06; C23C 16/08
See application file for complete search history.

(56) References Cited

U.S. PATENT DOCUMENTS

2005/0009325 A1\* 1/2005 Chung .................... C23C 16/02
438/653
2020/0006073 A1\* 1/2020 Smith ..................... C23C 16/24
(Continued)

FOREIGN PATENT DOCUMENTS

KR 2003-0003357 \* 1/2003 ............. C23C 16/40

OTHER PUBLICATIONS

Lim, Booyong S., et al., "Atomic layer deposition of transition metals". Nature Materials, vol. 2, Nov. 2003, pp. 749-754.\*
(Continued)

*Primary Examiner* — Bret P Chen
(74) *Attorney, Agent, or Firm* — Laine IP Oy; Mark W. Scott

(57) ABSTRACT

The current disclosure relates to methods for forming a film comprising transition metal on a substrate. The disclosure further relates to a transition metal layer, to a structure and a device comprising a layer that comprises a transition metal. In the method, transition metal is deposited on a substrate by a cyclic deposition process. The method comprises providing a substrate in a reactor chamber and executing a cyclical deposition process. The cyclical deposition process comprises the steps of providing a transition metal precursor in vapor phase into the reaction chamber and providing a halogen precursor in vapor phase into the reaction chamber to form a film comprising elemental transition metal on a substrate. The halogen precursor comprises only one halogen atom. The disclosure further relates to a deposition assembly for depositing a material comprising transition metal on a substrate.

19 Claims, 2 Drawing Sheets

(56) References Cited

U.S. PATENT DOCUMENTS

Figure 2:
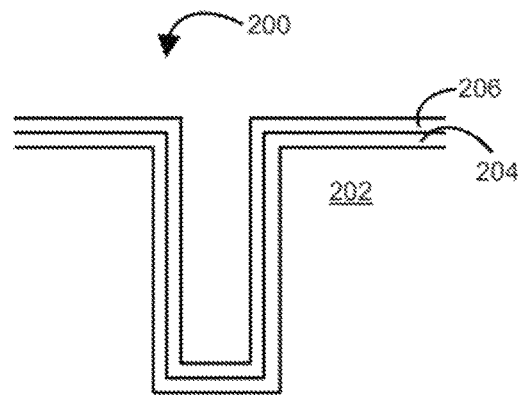

| | | |
|---|---|---|
| 2022/0139713 A1 | 5/2022 | Färm |
| 2022/0195599 A1 | 6/2022 | Dezelah |
| 2022/0251701 A1* | 8/2022 | Mattinen ................. C23C 16/04 |
| 2022/0411919 A1 | 12/2022 | Färm |
| 2023/0086838 A1 | 3/2023 | Keating |

OTHER PUBLICATIONS

Kim, Hyungjun, et al., "Atomic layer deposition of transition metals for silicide contact formation: Growth characteristics and silicidation". Microelectronic Engineering, vol. 106, Jun. 2013, pp. 69-75.*

Maina, J. W., et al., "Atomic layer deposition of transition metal films and nanostructures for electronic and catalytic applications". Critical Reviews in Solid State and Materials Sciences, 46(5), (2020) 468-489. Abstract Only.*

* cited by examiner

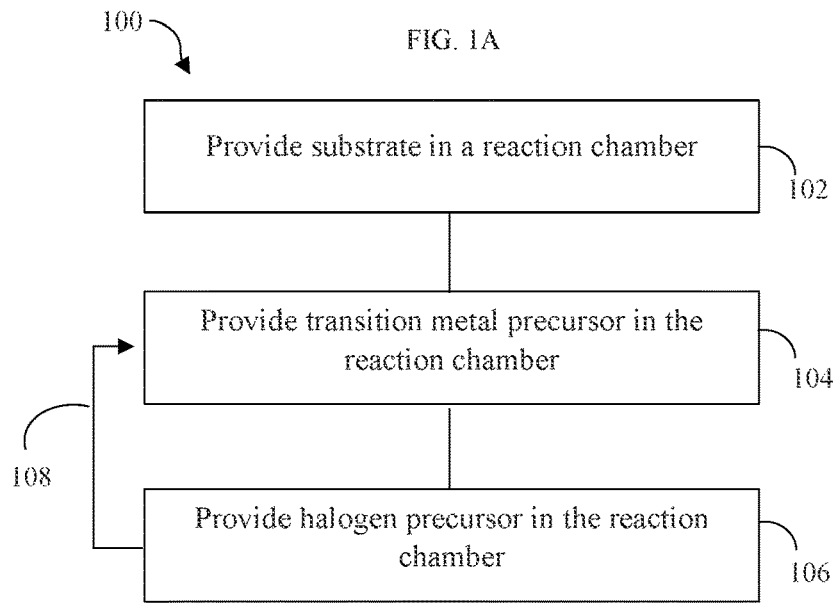
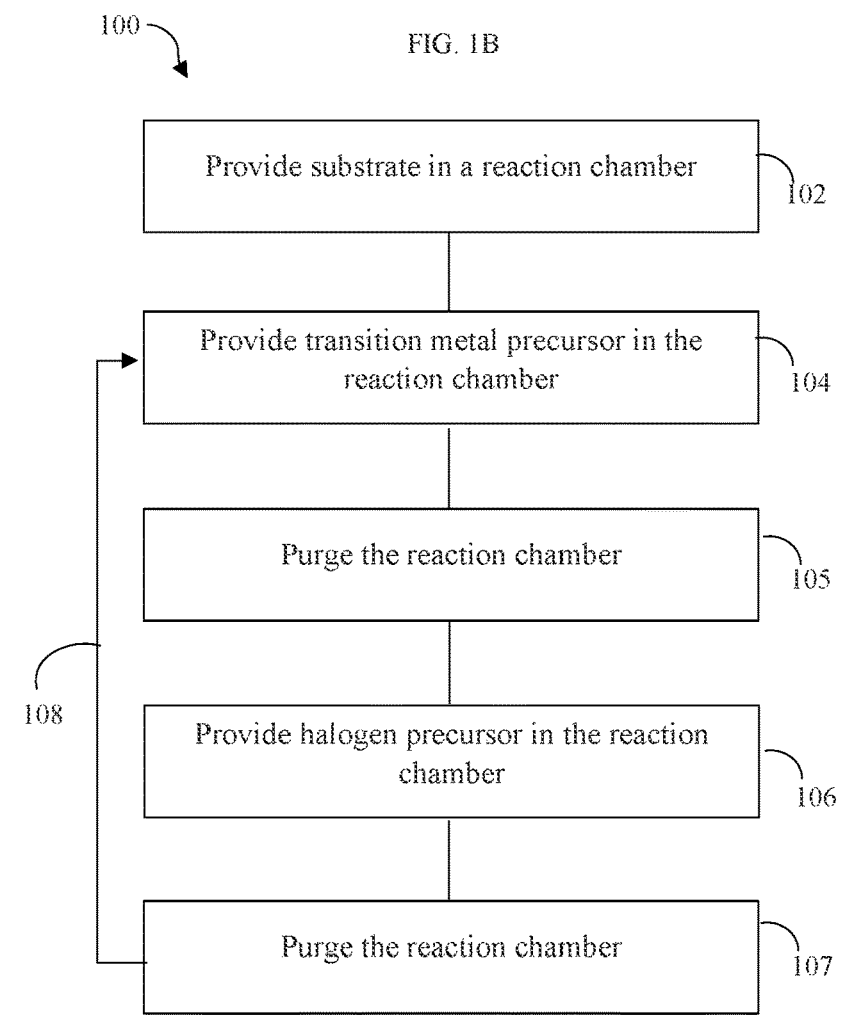

TRANSITION METAL DEPOSITION PROCESSES AND DEPOSITION ASSEMBLY

CROSS-REFERENCE TO RELATED APPLICATIONS

This application claims priority to and the benefit of U.S. Provisional Application No. 63/434,951, filed Dec. 23, 2022, the entirety of which is incorporated by reference herein.

FIELD OF INVENTION

The present disclosure relates to methods and apparatuses for the manufacture of semiconductor devices. More particularly, the disclosure relates to methods and assemblies for depositing transition metal containing material on a substrate, and layers comprising a transition metal.

BACKGROUND OF THE DISCLOSURE

Semiconductor device fabrication processes generally use advanced deposition methods for forming metal and metal-containing layers. Transition metals, such as molybdenum, may have many of the advantages sought in the art. For example, they may be useful as a conductor in back end of line (BEOL) or mid end of line (MEOL) applications, or in buried power rail or in work function layer in logic applications and in word or bit line in advanced memory applications. However, the deposition of high quality transition metal thin films by cyclical deposition methods remains challenging due to the electropositive nature of transition metals, especially molybdenum, and its tendency to form nitride or carbide phases. Thus there is need in the art for alternative or improved methods for depositing materials comprising one or more transition metals with low amounts of carbon and/or nitrogen. Transition metal halides, such as transition metal iodides, may find use in various applications, ranging from patterning to BEOL metals.

Any discussion, including discussion of problems and solutions, set forth in this section has been included in this disclosure solely for the purpose of providing a context for the present disclosure. Such discussion should not be taken as an admission that any or all of the information was known at the time the invention was made or otherwise constitutes prior art.

SUMMARY OF THE DISCLOSURE

This summary is provided to introduce a selection of concepts in a simplified form. These concepts are described in further detail in the detailed description of example embodiments of the disclosure below. This summary is not intended to identify key features or essential features of the claimed subject matter, nor is it intended to be used to limit the scope of the claimed subject matter.

Various embodiments of the present disclosure relate to methods of depositing transition metal.

In the current disclosure, methods for forming a film comprising a transition metal on a substrate by a cyclic deposition process are disclosed. The methods comprise providing a substrate in a reactor chamber and executing a cyclical deposition process. The cyclical deposition process comprises the steps of providing a transition metal precursor in vapor phase into the reaction chamber and providing a halogen precursor in vapor phase into the reaction chamber. The formed film comprises a transition metal on a substrate and the halogen precursor comprises only one halogen atom.

In another aspect, methods for forming a film comprising elemental transition metal on a substrate by a cyclic deposition process are disclosed. The methods comprise providing a substrate in a reactor chamber and executing a cyclical deposition process. The cyclical deposition process comprises the steps of providing a transition metal precursor in vapor phase into the reaction chamber and providing a halogen precursor in vapor phase into the reaction chamber. The formed film comprises elemental transition metal on a substrate and the halogen precursor comprises only one halogen atom.

The current disclosure further relates to a transition metal layer produced by the methods according to the current disclosure. Thus, a substrate is provided in a reactor chamber, a transition metal precursor is provided into the reactor chamber in vapor phase, and a halogen precursor is provided into the reactor chamber in vapor phase, to form a layer comprising transition metal on the substrate.

In an additional aspect, the current disclosure relates to a semiconductor structure comprising transition metal deposited by a method according to the current disclosure. The transition metal comprised in the structure may be deposited as a layer. In other words, it may be a transition metal layer. As used herein, a "structure" can be or include a substrate as described herein. Structures can include one or more layers overlying the substrate, such as one or more layers formed by a method according to the current disclosure. The structure may be, for example, via or a line in BEOL, or a contact or a local interconnect in MEOL. The structure may also be a work function layer in a gate electrode, or a buried power rail in logic applications, as well as a word line or a bit line in an advanced memory application.

In another aspect, a semiconductor device comprising transition metal deposited by a method according to the current disclosure. The device may be, for example, a logic or a memory device, or a gate electrode in device.

In a further aspect, a deposition assembly is disclosed. The deposition assembly is constructed and arranged to deposit a material comprising transition metal on a substrate. The deposition assembly for depositing a material comprising transition metal on a substrate according to the current disclosure comprises one or more reaction chambers constructed and arranged to hold the substrate, a precursor injector system constructed and arranged to provide a transition metal precursor and a halogen precursor into the reaction chamber in a vapor phase. The deposition assembly further comprises a first precursor vessel constructed and arranged to contain and evaporate a transition metal precursor comprising a transition metal atom. The deposition assembly further comprises a second precursor vessel constructed and arranged to contain and evaporate a halogen precursor. The deposition assembly is constructed and arranged to provide the transition metal precursor and the halogen precursor via the precursor injector system to the reaction chamber to deposit material comprising transition metal on the substrate. In an embodiment, the deposition assembly is constructed and arranged to deposit a material comprising elemental transition metal on a substrate.

In this disclosure, any two numbers of a variable can constitute a workable range of the variable, and any ranges indicated may include or exclude the endpoints. Additionally, any values of variables indicated (regardless of whether they are indicated with "about" or not) may refer to precise values or approximate values and include equivalents, and may refer to average, median, representative, majority, or the like. Further, in this disclosure, the terms "including," "constituted by" and "having" refer independently to "typically or broadly comprising," "comprising," "consisting essentially of," or "consisting of" in some embodiments. In this disclosure, any defined meanings do not necessarily exclude ordinary and customary meanings in some embodiments.

BRIEF DESCRIPTION OF THE DRAWING FIGURES

The accompanying drawings, which are included to provide a further understanding of the disclosure and constitute a part of this specification, illustrate exemplary embodiment, and together with the description help explain the principles of the disclosure. In the drawings FIG. 1, panels A and B, illustrates three exemplary embodiments of a method according to the current disclosure.

FIG. 2 depicts an exemplary structure comprising a layer comprising transition metal according to the current disclosure.

Figure 3:
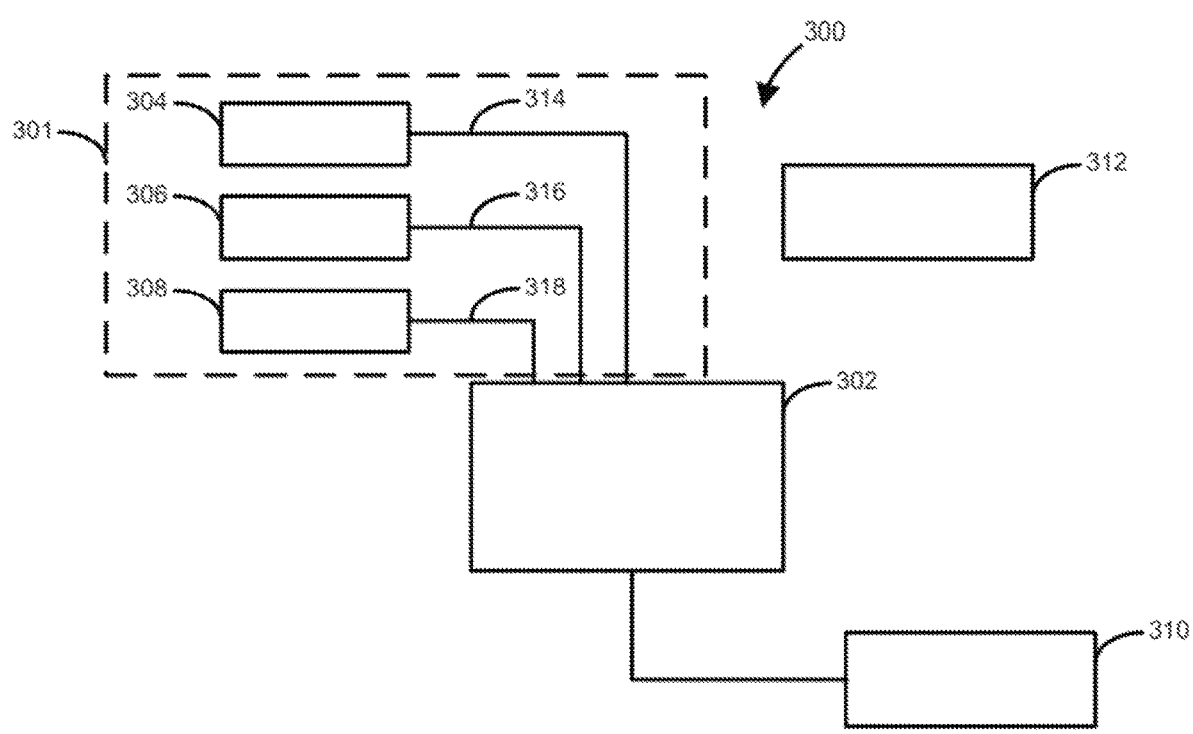

FIG. 3 presents a deposition apparatus according to the current disclosure in a schematic manner.

It will be appreciated that elements in the figures are illustrated for simplicity and clarity and have not necessarily been drawn to scale. For example, the dimensions of some of the elements in the figures may be exaggerated relative to other elements to help improve understanding of illustrated embodiments of the present disclosure.

DETAILED DESCRIPTION OF EXEMPLARY EMBODIMENTS

Although certain embodiments and examples are disclosed below, it will be understood by those in the art that the invention extends beyond the specifically disclosed embodiments and/or uses of the invention and obvious modifications and equivalents thereof. Thus, it is intended that the scope of the invention disclosed should not be limited by the particular disclosed embodiments described below As used herein, the term "substrate" may refer to any underlying material or materials, including any underlying material or materials that may be modified, or upon which, a device, a circuit, or a film may be formed. The "substrate" may be continuous or non-continuous; rigid or flexible; solid or porous; and combinations thereof. The substrate may be in any form, such as a powder, a plate, or a workpiece. Substrates in the form of a plate may include wafers in various shapes and sizes. Substrates may be made from semiconductor materials, including, for example, silicon, silicon germanium, silicon oxide, gallium arsenide, gallium nitride and silicon carbide.

A continuous substrate may extend beyond the bounds of a process chamber where a deposition process occurs. In some processes, the continuous substrate may move through the process chamber such that the process continues until the end of the substrate is reached. A continuous substrate may be supplied from a continuous substrate feeding system to allow for manufacture and output of the continuous substrate in any appropriate form.

The illustrations presented herein are not meant to be actual views of any particular material, structure, or device, but are merely idealized representations that are used to describe embodiments of the disclosure.

The particular implementations shown and described are illustrative of the invention and are not intended to otherwise limit the scope of the aspects and implementations in any way. Indeed, for the sake of brevity, conventional manufacturing, connection, preparation, and other functional aspects of the system may not be described in detail. Furthermore, the connecting lines shown in the various figures are intended to represent exemplary functional relationships and/or physical couplings between the various elements. Many alternative or additional functional relationship or physical connections may be present in the practical system, and/or may be absent in some embodiments.

It is to be understood that the configurations and/or approaches described herein are exemplary in nature, and that these specific embodiments or examples are not to be considered in a limiting sense, because numerous variations are possible. The specific routines or methods described herein may represent one or more of any number of processing strategies. Thus, the various acts illustrated may be performed in the sequence illustrated, in other sequences, or omitted in some cases.

The subject matter of the present disclosure includes all novel and nonobvious combinations and subcombinations of the various processes, systems, and configurations, and other features, functions, acts, and/or properties disclosed herein, as well as any and all equivalents thereof.

The current disclosure relates to a method for forming a film comprising elemental transition metal on a substrate by a cyclic deposition process. The method comprises providing a substrate in a reactor chamber and executing a cyclical deposition process. The cyclical deposition process comprises the steps of providing a transition metal precursor in vapor into the reaction chamber; and providing a halogen precursor in vapor phase into the reaction chamber to form a film comprising elemental transition metal on a substrate. According to the method, the halogen precursor comprises only one halogen atom.

The terms "precursor" and "reactant" can refer to molecules (compounds or molecules comprising a single element) that participate in a chemical reaction that produces another compound. A precursor typically contains portions that are at least partly incorporated into the compound or element resulting from the chemical reaction in question. Such a resulting compound or element may be deposited on a substrate. A reactant may me an element or a compound that is not incorporated into the resulting compound or element to a significant extent. The terms precursor and reactant can be used interchangeably.

As used herein, "a transition metal precursor" includes a gas or a material that can become gaseous and that can be represented by a chemical formula that includes a transition metal. In some embodiments, the transition metal precursor comprises a group V to VI transition metal. In some embodiments, the transition metal precursor comprises a group VI transition metal. In some embodiments, the transition metal is selected from the group consisting of chromium, molybdenum, tungsten, vanadium and niobium. In some embodiments, the transition metal precursor is provided in a mixture of two or more compounds. In a mixture, the other compounds in addition to the transition metal precursor is provided in a composition. Compositions suitable for use as composition can include a transition metal compound and an effective amount of one or more stabilizing agents. Compositions may be a solution or a gas in standard conditions.

As used herein, "a halogen precursor" includes a gas or a material that can become gaseous and that can be represented by a chemical formula that includes a halogen. In some embodiments, the halogen precursor is provided in a mixture of two or more compounds. In a mixture, the other compounds in addition to the halogen precursor is provided in a composition. Compositions suitable for use as composition can include a haloalkane compound and an effective amount of one or more stabilizing agents. Compositions may be a solution or a gas in standard conditions.

In some embodiments, the transition metal precursor comprises a metal-organic precursor or an organometallic precursor. By an organometallic compound, it is herein meant a transition metal atom and a hydrocarbon ligand, wherein the transition metal atom is directly bonded to a carbon atom. In embodiments in which an organometallic compound comprises two or more metal atoms, all of the metal atoms are directly bonded with a carbon atom.

In some embodiments, the transition metal precursor comprises an additional ligand. In some embodiments, transition metal precursor comprises cyclic portions. In some embodiments, the transition metal precursor comprises a benzene or a cyclopentadienyl group. In some embodiments, the transition metal comprises a transition metal atom and at least one aryl group ligand bonded to the metal atom. In some embodiments, the aryl group is an η6 aryl ligand. In some embodiments, the transition metal precursor comprises a transition metal atom and at least one benzene ring ligand bonded to the metal atom. In some embodiments, the transition metal precursor comprises a transition metal atom and a bis-arene ligand bonded to the metal atom. In some embodiments, the transition metal precursor comprises a transition metal atom and at least one alkyl-arene ligand bonded to the metal atom. In some embodiments, the transition metal precursor comprises a transition metal atom and bis(ethyl benzene) ligand. In some embodiments, the transition metal precursor is selected from a group consisting of $Cr(EtBz)_2$, $W(EtBz)_2$ and $Mo(EtBz)_2$. In some embodiments, the transition metal precursor comprises, consists essentially of or consists of $Mo(EtBz)_2$.

In some embodiments, the halogen precursor comprises a halogenated hydrocarbon comprising only one halogen atom. The halogen precursor may comprise two or three carbon atoms. Further, the halogen precursor may comprise four, five, six, seven or eight carbon atoms. The halogen precursor may comprise a linear, branched, cyclical and/or aromatic carbon chain. For example, the halogen precursor may comprise a halogenated ethane, propane, benzene, 2-methylpropane, 2,2-dimethylpropane (neopentane), n-butane, 2-methylbutane, 2,2-dimethylbutane, n-pentane, 2-methylpantane, 3-methylpentane or an n-hexane. In some embodiments, the hydrocarbon comprises and aryl group. In some embodiments, the halogen precursor comprises halobenzene.

In some embodiments, the halogen precursor comprises only one halogen atom. The halogen atom is selected from the group consisting of bromine, iodine, fluorine, and chlorine. The location of the said one carbon atom in a carbon chain may vary. In some embodiments, it is located at the end of a carbon chain, but in some embodiments, it is located away from the end of the carbon chain. In the case of a cyclic hydrocarbon, the halogen may be located at any of the carbon atoms. As is evident to those skilled in the art, the position of a given carbon atom in a carbon chain limits the number of potential substituents available. In some embodiments, the halogen precursor comprises, consists essentially of, or consists of iodobenzene or 1-iodobutane. In some embodiments, the halogen precursor comprises, consists essentially of, or consists of bromobenzene or 1-bromobutane.

In some embodiments, the halogen precursor comprises an allyl halide. The halogen precursor may comprise one halogen atom attached to the corresponding amount of allylic carbons in an allyl halide.

In some embodiments, the halogen precursor comprises a vinyl halide. The halogen precursor may comprise one halogen atom attached to the corresponding amount of vinylic carbons in a vinyl halide.

In some embodiments, the transition metal precursor is provided to the reactor chamber at a temperature from about 150° C. to about 400° ° C. For example, transition metal may be deposited at a temperature from about 200° ° C. to about 400° C., or at a temperature from about 250° C. to about 375° C. In some embodiments of the current disclosure, transition metal may be deposited at a temperature from about 260° C. to about 330° C., or at a temperature from about 270° C. to about 330° C. In some embodiments, transition metal may be deposited at a temperature from about 150° C. to about 200° C., or at a temperature from about 300° C. to about 400° C., or at a temperature from about 280° ° C. to about 320° C. For example, transition metal may be deposited at a temperature of about 210° C. or about 225° C. or about 285° C., or about 290° ° C., or about 310° C., or about 315° C. or about 325° C., or about 375° C., or about 380° C., or about 385° C., or about 390° ° C.

In some embodiments, the halogen precursor is provided to the reactor chamber at a temperature from about 150° ° C. to about 400° C. For example, halogen precursor may be deposited at a temperature from about 200° ° C. to about 400° C. In some embodiments of the current disclosure, halogen precursor may be deposited at a temperature from about 250° C. to about 375° C., or at a temperature from about 260° C. to about 330° ° C. In some embodiments, halogen precursor may be deposited at a temperature from about 150° C. to about 200° ° C., or at a temperature from about 300° ° C. to about 400° C., or at a temperature from about 280° C. to about 320° ° C. For example, halogen precursor may be deposited at a temperature of about 210° C. or about 225° C. or about 285° C., or about 290° C., or about 310° C., or about 315° C. or about 325° C., or about 375° C., or about 380° C., or about 385° C., or about 390° C.

A pressure in a reaction chamber may be selected independently for different process steps. In some embodiments, a first pressure may be used during a transition metal precursor pulse, and a second pressure may be used during a halogen precursor pulse. A third or a further pressure may be used during purging or other process steps. In some embodiments, a pressure within the reaction chamber during the deposition process is at atmospheric pressure, or less than 760 Torr, or wherein a pressure within the reaction chamber during the deposition process is between 0.2 Torr and 760 Torr, or between 1 Torr and 100 Torr, or between 1 Torr and 10 Torr. In some embodiments, a pressure within the reaction chamber during the deposition process is less than about 0.001 Torr, less than 0.01 Torr, less than 0.1 Torr, less than 1 Torr, less than 10 Torr, less than 50 Torr, less than 100 Torr or less than 300 Torr. In some embodiments, a pressure within the reaction chamber during at least a part of the method according to the current disclosure is less than about 0.001 Torr, less than 0.01 Torr, less than 0.1 Torr, less than 1 Torr, less than 10 Torr or less than 50 Torr, less than 100 Torr or less than 300 Torr. For example, in some embodiments, a first pressure may be about 0.1 Torr, about 0.5 Torr, about 1 Torr, about 5 Torr, about 10 Torr, about 20 Torr or about 50 Torr. In some embodiments, a second pressure is about 0.1 Torr, about 0.5 Torr, about 1 Torr, about 5 Torr, about 10 Torr, about 20 Torr or about 50 Torr.

In some embodiments, the transition metal precursor and the halogen precursor are supplied in pulses, the halogen precursor is supplied in pulses and the reaction chamber is purged between consecutive pulses of transition metal precursors and halogen precursors. The length of a transition metal precursor pulse or a halogen precursor pulse may be, for example, from about 0.01 s to about 120 s, for example from about 0.01 s to about 5 s, or from about 1 s to about 20 s, or from about 0.5 s to about 10 s, or from about 5 s to about 15 s, or from about 10 s to about 30 s, or from about 10 s to about 60 s, or from about 20 s to about 60 s. The length of a transition metal precursor or a halogen precursor pulse may be, for example, 0.03 s, 0.1 s, 0.5 s, 1 s, 1.5 s, 2 s, 2.5 s, 3 s, 4 s, 5 s, 8 s, 10 s, 12 s, 15 s, 25 s, 30 s, 40 s, 50 s or 60 s. In some embodiments, the transition metal precursor pulse time may be at least 5 seconds, or at least 10 seconds, or at least 20 seconds, or at least 30 seconds. In some embodiments, the transition metal precursor pulse time may be at most 5 seconds, or at most 10 seconds or at most 20 seconds, or at most 30 seconds. In some embodiments, the halogen precursor pulse time may be at least 15 seconds, or at least 30 seconds, or at least 45 seconds, or at least 60 seconds. In some embodiments, the halogen precursor pulse time may be at most 15 seconds, or at most 30 seconds or at most 45 seconds, or at most 60 seconds.

The pulse times for transition metal precursor and halogen precursor vary independently according to process in question. The selection of an appropriate pulse time may depend on the substrate topology. For higher aspect ratio structures, longer pulse times may be needed to obtain sufficient surface saturation in different areas of a high aspect ratio structure. Also, the selected transition metal precursor and halogen precursor chemistries may influence suitable pulsing times. For process optimization purposes, shorter pulse times might be preferred as long as appropriate layer properties can be achieved. In some embodiments, transition metal precursor pulse time is longer than halogen precursor pulse time. In some embodiments, halogen precursor pulse time is longer than transition metal precursor pulse time. In some embodiments, transition metal precursor pulse time is same as halogen precursor pulse time.

In some embodiments, transition metal precursor may be pulsed more than one time, for example two, three or four times, before a halogen is pulsed to the reaction chamber. Similarly, there may be more than one pulse, such as two, three or four pulses, of a halogen precursor before transition metal precursor is pulsed (i.e. provided) to the reaction chamber.

In some embodiments, the method comprises removing excess transition metal precursor from the reaction chamber by an inert gas prior to providing the halogen precursor in the reaction chamber. In some embodiments, the reaction chamber is purged between providing a transition metal precursor in a reaction chamber and providing a halogen precursor in the reaction chamber. In some embodiments, there is a purge step between every pulse. Thus, the reaction chamber may be purged also between two pulses of the same chemistry, such as a transition metal precursor or a halogen precursor.

As used herein, the term "purge" may refer to a procedure in which vapor phase precursors and/or vapor phase byproducts are removed from the substrate surface for example by evacuating the reaction chamber with a vacuum pump and/or by replacing the gas inside a reaction chamber with an inert or substantially inert gas such as argon or nitrogen. Purging may be effected between two pulses of gases which react with each other. However, purging may be effected between two pulses of gases that do not react with each other. For example, a purge, or purging may be provided between pulses of two precursors. Purging may avoid or at least reduce gas-phase interactions between the two gases reacting with each other. It shall be understood that a purge can be effected either in time or in space, or both. For example in the case of temporal purges, a purge step can be used e.g. in the temporal sequence of providing a first precursor to a reactor chamber, providing a purge gas to the reactor chamber, and providing a second precursor to the reactor chamber, wherein the substrate on which a layer is deposited does not move. For example in the case of spatial purges, a purge step can take the following form: moving a substrate from a first location to which a first precursor is continually supplied, through a purge gas curtain, to a second location to which a second precursor is continually supplied. Purging times may be, for example, from about 0.01 seconds to about 20 seconds, from about 1 s to about 20 s, or from about 0.5 s to about 10 s, or between about 1 s and about 7 seconds, such as 5 s, 6 s or 8 s. However, other purge times can be utilized if necessary, such as where highly conformal step coverage over extremely high aspect ratio structures or other structures with complex surface morphology is needed, or in specific reactor types, such as a batch reactor, may be used.

In some embodiments, the film comprising transition metal is deposited on the substrate as a layer. In such embodiments, transition metal forms a transition metal layer. As used herein, a "transition metal layer" can be a material layer that contains transition metal. As used herein, the term "layer" and/or "film" can refer to any continuous or non-continuous structure and material, such as material deposited by the methods disclosed herein. For example, layer and/or film can include two-dimensional materials, three-dimensional materials, nanoparticles or even partial or full molecular layers or partial or full atomic layers or clusters of atoms and/or molecules. A film or layer may comprise material or a layer with pinholes, which may be at least partially continuous. A seed layer may be a non-continuous layer serving to increase the rate of nucleation of another material. However, the seed layer may also be substantially or completely continuous.

In the current disclosure, a transition metal, such as chromium, molybdenum, tungsten, vanadium, tantalum, or niobium, may be deposited predominantly, or in some embodiments substantially completely or completely, as an elemental metal. By "elemental metal," it is herein meant a metal, such as molybdenum, niobium or vanadium, with an oxidation state of zero. A transition metal deposited according to the current disclosure may comprise elemental metal and other forms of molybdenum. For example, a transition metal deposited according to the current disclosure may have partly an oxidation state of 0, +2, +3, +4, +5 and/or +6. In some embodiments, at least 60% of the transition metal is deposited as elemental metal. In some embodiments, at least 80% or at least 90% of transition metal is deposited as elemental metal. In some embodiments, at least 93% or 95% of transition metal is deposited as elemental metal.

In some embodiments, the film is deposited as a layer. In some embodiments the layer has a thickness of 0.1 nm to 100 nm, for example 1 nm to 30 nm, such as 1 to 20 nm, for example, 1 to 10 nm.

The substrate in the current disclosure may be any underlying material or materials that can be used to form, or upon which, a structure, a device, a circuit, or a layer can be formed. A substrate can include a bulk material, such as silicon (e.g., single-crystal silicon), other Group IV materials, such as germanium, or other semiconductor materials, such as a Group II-VI or Group III-V semiconductor materials, and can include one or more layers overlying or underlying the bulk material. Further, the substrate can include various features, such as recesses, protrusions, and the like formed within or on at least a portion of a layer of the substrate. For example, a substrate can include bulk semiconductor material and an insulating or dielectric material layer overlying at least a portion of the bulk semiconductor material. Substrate may include nitrides, for example TiN, oxides, insulating materials, dielectric materials, conductive materials, metals, such as such as tungsten, ruthenium, molybdenum, cobalt, aluminum or copper, or metallic materials, crystalline materials, epitaxial, heteroepitaxial, and/or single crystal materials. In some embodiments of the current disclosure, the substrate comprises silicon. The substrate may comprise other materials, as described above, in addition to silicon. The other materials may form layers.

The method of depositing transition metal according to the current disclosure comprises providing a substrate in a reaction chamber. In other words, a substrate is brought into space where the deposition conditions can be controlled. The reaction chamber may be part of a cluster tool in which different processes are performed to form an integrated circuit. In some embodiments, the reaction chamber may be a flow-type reactor, such as a cross-flow reactor. In some embodiments, the reaction chamber may be a showerhead reactor. In some embodiments, the reaction chamber may be a space-divided reactor. In some embodiments, the reaction chamber may be single wafer ALD reactor. In some embodiments, the reaction chamber may be a high-volume manufacturing single wafer ALD reactor. In some embodiments, the reaction chamber may be a batch reactor for manufacturing multiple substrates simultaneously.

In the method according to the current disclosure, the transition metal precursor and halogen precursor may be in vapor phase when it is in a reaction chamber. The transition metal precursor and halogen precursor may be partially gaseous or liquid, or even solid at some points in time prior to being provided in the reaction chamber. In other words, a transition metal precursor and halogen precursor may be solid, liquid or gaseous, for example, in a precursor vessel or other receptacle before delivery in a reaction chamber. Various means of bringing the precursor in to gas phase can be applied when delivery into the reaction chamber is performed. Such means may include, for example, heaters, vaporizers, gas flow or applying lowered pressure, or any combination thereof. Thus, the method according to the current disclosure may comprise heating the transition metal precursor and halogen precursor prior to providing it to the reaction chamber. In some embodiments, transition metal precursor is heated to at least 100° C., or to at least 110° C., or to at least 120° C. or to at least 130° C. or to at least 140° ° C. in the vessel. In some embodiments halogen precursor is at room temperature or at least 20° C. or at least 25° C. or at least 30° C. in the vessel. Also the injector system may be heated to improve the vapor phase delivery of the transition metal precursor and halogen precursor to the reaction chamber.

In some embodiments, a material comprising a transition metal, such as a metallic molybdenum film, is deposited on a metal surface. Thus, the substrate surface comprises metal. In some embodiments, a metal surface consists essentially of, or consists of, metal. In some embodiments, the metal surface is a transition metal surface. In some embodiments, the metal of the metal surface is selected from a group consisting of titanium, vanadium, niobium, tantalum, chromium, molybdenum, tungsten, ruthenium, cobalt, nickel, platinum, copper and zinc. In some embodiments, the metal surface is a titanium surface. In some embodiments, the metal surface is a vanadium surface. In some embodiments, the metal surface is a niobium surface. In some embodiments, the metal surface is a tantalum surface. In some embodiments, the metal surface is a molybdenum surface. In some embodiments, the metal surface is a tungsten surface. In some embodiments, the metal surface is a cobalt surface. In some embodiments, the metal surface is a copper surface.

Without limiting the current disclosure to any specific theory, using a halogen precursor comprising one halogen atom may have benefits in depositing material comprising a transition metal according to the current disclosure on a metal surface. For example, the corrosion of the metal surface, such as a copper surface, may be reduced. In particular, halogen precursors containing more than one halogen atom may corrode sensitive surfaces more easily than the halogen precursors disclosed herein. However, a material comprising a transition metal may be deposited on other surfaces than metal surfaces. For example, the material comprising a transition metal may be deposited on dielectric surfaces, such as silicon oxide surfaces, on high-k surfaces, such as hafnium oxide surfaces or zirconium oxide surfaces or hafnium zirconium oxide surfaces.

In some embodiments, the material comprising transition metal according to the current disclosure may be deposited selectively. In such embodiments, the substrate comprises a first surface and a second surface. The first surface and the second surface have different material properties, allowing for the selective deposition of a material comprising a transition metal on the first surface. Selectivity can be given as a percentage calculated by [(deposition on first surface)−(deposition on second surface)]/(deposition on the first surface). Deposition can be measured in any of a variety of ways. In some embodiments, deposition may be given as the measured thickness of the deposited material. In some embodiments, deposition may be given as the measured amount of material deposited.

In some embodiments, selectivity is greater than about 30%. In some embodiments, selectivity is greater than about 50%. In some embodiments, selectivity is greater than about 75% or greater than about 85%. In some embodiments, selectivity is greater than about 90% or greater than about 93%. In some embodiments, selectivity is greater than about 95% or greater than about 98%. In some embodiments, selectivity is greater than about 99% or even greater than about 99.5%. In embodiments, the selectivity can change over the duration or thickness of a deposition.

In some embodiments, deposition only occurs on the first surface and does not occur on the second surface. In some embodiments, deposition on the first surface of the substrate relative to the second surface of the substrate is at least about 80% selective, which may be selective enough for some particular applications. In some embodiments the deposition on the first surface of the substrate relative to the second surface of the substrate is at least about 50% selective, which may be selective enough for some particular applications. In some embodiments the deposition on the first surface of the substrate relative to the second surface of the substrate is at least about 10% selective, which may be selective enough for some particular applications.

In some embodiments, selective deposition is inherent, and no additional processing steps over those conveniently performed on a substrate are necessary. Selectivity may be inherent to a certain thickness of deposited material, and be lost in case deposition is continued beyond a process-specific threshold. Thus, it may be possible to deposit a material layer of, for example, about 1 nm, about 2 nm, about 3 nm, about 5 nm or about 6 nm before selectivity is lost. In some embodiments, the selectivity is mainly attributable to slower initiation of growth on the second surface relative to the first surface.

In some embodiments, the first surface is a metal surface or a metal-containing surface, and the second surface is a low k surface. For example the first surface may comprise, consist essentially of, or consist of, a transition metal, such as ruthenium, cobalt, nickel, copper or zinc. In some embodiments, the first surface comprises, consists essentially of, or consists of, a row 4 transition metal, such as titanium, vanadium, chromium, manganese, cobalt, nickel, copper or zinc. In some embodiments, the first surface comprises, consists essentially of, or consists of, a row 5 transition metal, such as yttrium, zirconium, niobium, molybdenum or ruthenium. In some embodiments, the first surface comprises, consists essentially of, or consists of a metal nitride. For example, the first surface may comprise titanium nitride. In some embodiments, the first surface comprises silicon. In some embodiments, the first surface comprises, consists essentially of, or consists of silicon oxide.

In some embodiments, the temperature of selectively depositing the material comprising a transition metal is performed at a temperature of between about 250° C. and about 400° C., such as at a temperature of about 300° C. or about 325° C., or about 350° C. or about 375° C.

For example, the nucleation delay of metallic (i.e. substantially elemental) molybdenum grown using Mo(EtBz)$_2$ and iodobenzene as transition metal precursor and halogen precursor, respectively, may be delayed by at least about 50 cycles or at least about 75 cycles or about 100 cycles on low k surface (second surface) relative to silicon oxide surface, titanium nitride surface or a ruthenium surface (first surface) at a deposition temperature of about 350° C. This may lead to the growth of metallic molybdenum on the first surface to a thickness of up to about 6 nm before growth is observed on the second surface.

In this disclosure, "gas" can include material that is a gas at normal temperature and pressure (NTP), a vaporized solid and/or a vaporized liquid, and can be constituted by a single gas or a mixture of gases, depending on the context. Transition metal precursor and halogen precursor may be provided to the reaction chamber in gas phase. The term "inert gas" can refer to a gas that does not take part in a chemical reaction and/or does not become a part of a layer to an appreciable extent. Exemplary inert gases include He and Ar and any combination thereof. In some cases, molecular nitrogen and/or hydrogen can be an inert gas. A gas other than a process gas, i.e., a gas introduced without passing through a precursor injector system, other gas distribution device, or the like, can be used for, e.g., sealing the reaction space, and can include a seal gas.

In the current disclosure, the deposition process may comprise a cyclical deposition process, such as an atomic layer deposition (ALD) process or a cyclical chemical vapor deposition (CVD) process. The term "cyclical deposition process" can refer to the sequential introduction of transition metal precursors, halogen precursors and possible reactants into a reaction chamber to deposit material, such as transition metal, on a substrate. Cyclic deposition includes processing techniques such as atomic layer deposition (ALD), cyclical chemical vapor deposition (cyclical CVD), and hybrid cyclical deposition processes that include an ALD component and a cyclical CVD component. The process may comprise a purge step between providing precursors or between providing a transition metal precursor and a halogen precursor in the reaction chamber.

The process may comprise one or more cyclical phases. In some embodiments, the process comprises or one or more cyclical phases. In some embodiments, the deposition process comprises the continuous flow of at least one precursor. In some embodiments, a halogen precursor may be continuously provided in the reaction chamber. In such an embodiment, the process comprises a continuous flow of a halogen precursor.

The term "atomic layer deposition" (ALD) can refer to a vapor deposition process in which deposition cycles, such as a plurality of consecutive deposition cycles, are conducted in a reaction chamber. The term atomic layer deposition, as used herein, is also meant to include processes designated by related terms, such as chemical vapor atomic layer deposition, when performed with alternating pulses of precursor(s)/reactant(s), and optional purge gas(es). Generally, for ALD processes, during each cycle, a first precursor, such as a transition metal precursor, is introduced to a reaction chamber and is chemisorbed to a deposition surface (e.g., a substrate surface that may include a previously deposited material from a previous ALD cycle or other material), forming about a monolayer or sub-monolayer of material that does not readily react with additional precursor (i.e., a self-limiting reaction). Thereafter, in some cases, a second precursor (e.g., another precursor or a reaction gas), such as a halogen precursor, may subsequently be introduced into the process chamber for use in converting the chemisorbed precursor to the desired material on the deposition surface. The second precursor can be capable of further reaction with the first precursor. Purging steps may be utilized during one or more cycles, e.g., during each step of each cycle, to remove any excess first precursor, such as transition metal precursor, from the process chamber and/or remove any excess second precursor, such as halogen precursor, and/or reaction byproducts from the reaction chamber.

CVD-type processes may be characterized by vapor deposition which is not self-limiting. They typically involve gas phase reactions between two or more precursors and/or reactants. The precursor(s) and reactant(s) can be provided simultaneously to the reaction space or substrate, or in partially or completely separated pulses. However, CVD may be performed with a single precursor, or two or more precursors that do not react with each other. The single precursor may decompose into reactive components that are deposited on the substrate surface. The decomposition may be brought about by plasma or thermal means, for example. The substrate and/or reaction space can be heated to promote the reaction between the gaseous precursor and/or reactants. In some embodiments the precursor(s) and reactant(s) are provided until a layer having a desired thickness is deposited. In some embodiments, cyclic CVD processes can be used with multiple cycles to deposit a thin film having a desired thickness. In cyclic CVD processes, the precursors and/or reactants may be provided to the reaction chamber in pulses that do not overlap, or that partially or completely overlap.

According to an aspect, there is provided a transition metal layer produced according to the method of the current disclosure. In some embodiments, the layer is continuous or pinhole-free.

In some embodiments, a transition metal layer may comprise, for example, about 60 to about 99 atomic percentage (at. %) transition metal, or about 75 to about 99 at. % transition metal, or about 75 to about 95 at. % transition metal, or about 80 to about 95 at. % transition metal. A transition metal layer deposited by a method according to the current disclosure may comprise, for example about 80 at. %, about 83 at. %, about 85 at. %, about 87 at. %, about 90 at. %, about 95 at. %, about 97 at. % or about 99 at. % transition metal. In some embodiments, a transition metal layer may consist essentially of, or consist of transition metal. In some embodiments, transition metal layer may consist essentially of, or consist of transition metal. Layer consisting of transition metal may include an acceptable amount of impurities, such as oxygen, carbon, chlorine or other halogen, and/or hydrogen that may originate from one or more precursors used to deposit the transition metal layer.

In some embodiments, the method of depositing a material on a substrate is performed in an oxygen-free environment. The oxygen-free environment prevents the material from unwanted oxidation.

According to one aspect of the current disclosure, there is provided a semiconductor structure comprising transition metal deposited according to a method of depositing a material comprising transition metal on a substrate by a cyclic deposition process. The method comprises providing a substrate in a reactor chamber, providing a transition metal precursor in the reaction chamber in vapor phase and providing a halogen precursor to the reaction chamber in vapor phase to form a semiconductor structure.

According to one aspect of the current disclosure, there is provided a semiconductor device comprising transition metal deposited according to a method of depositing a material comprising transition metal on a substrate by a cyclic deposition process. The method comprises providing a substrate in a reactor chamber, providing a transition metal precursor in the reaction chamber in vapor phase and providing a halogen precursor to the reaction chamber in vapor phase to form a semiconductor device.

According to another aspect of the current disclosure, there is provided a deposition assembly for depositing transition metal on a substrate. The assembly comprises one or more reaction chambers constructed and arranged to hold the substrate, a precursor injector system constructed and arranged to provide a transition metal precursor and a halogen precursor into the reaction chamber in a vapor phase. The deposition assembly further comprises a first precursor vessel constructed and arranged to contain and evaporate a transition metal precursor comprising a transition metal atom and a carbon-containing ligand, wherein the transition metal atom is bonded to the ligand through the carbon. The deposition assembly further comprises a second precursor vessel constructed and arranged to contain and evaporate a halogen precursor. The deposition assembly is constructed and arranged to provide the transition metal precursor and the halogen precursor via the precursor injector system to the reaction chamber to deposit film comprising transition metal on the substrate.

In some embodiments, the assembly further comprises a temperature controller for controlling the temperature of the reaction chamber. The temperature in the reaction chamber can be set to be between 150° C. and 400° C. as described in the above disclosure.

The disclosure is further explained by the following exemplary embodiments depicted in the drawings. The illustrations presented herein are not meant to be actual views of any particular material, structure, or device, but are merely schematic representations to describe embodiments of the current disclosure. It will be appreciated that elements in the figures are illustrated for simplicity and clarity and have not necessarily been drawn to scale. For example, the dimensions of some of the elements in the figures may be exaggerated relative to other elements to help improve the understanding of illustrated embodiments of the present disclosure. The structures and devices depicted in the drawings may contain additional elements and details, which may be omitted for clarity.

FIG. 1, panels A and B, illustrates an exemplary embodiment of a method 100 according to the current disclosure. Method 100 may be used to form a film comprising transition metal. The film can be used during a formation of a structure or a device, such as a structure or a device described herein. However, unless otherwise noted, methods are not limited to such applications.

During step 102, a substrate is provided into a reaction chamber of a reactor. The reaction chamber can form part of an atomic layer deposition (ALD) reactor. The reactor may be a single wafer reactor. Alternatively, the reactor may be a batch reactor. Various phases of method 100 can be performed within a single reaction chamber or they can be performed in multiple reactor chambers, such as reaction chambers of a cluster tool. In some embodiments, the method 100 is performed in a single reaction chamber of a cluster tool, but other, preceding or subsequent, manufacturing steps of the structure or device are performed in additional reaction chambers of the same cluster tool. Optionally, a reactor including the reaction chamber can be provided with a heater to activate the reactions by elevating the temperature of one or more of the substrate and/or the reactants and/or precursors.

During step 102, the substrate can be brought to a desired temperature and pressure for providing transition metal precursor in the reaction chamber 104 and/or for providing halogen precursor in the reaction chamber 106. A temperature (e.g. of a substrate or a substrate support) within a reaction chamber can be, for example, from about 150° C. to about 400° C., or from about 250° ° C. to about 350° C. As a further example, a temperature within a reaction chamber can be from about 275° ° C. to about 325° C., or from about 280° ° C. to about 320° C. Exemplary temperatures within the reaction chamber may be 225° C., 250° ° C., 275° C., 285° C., 300° C., 310° C., 320° C., and 330° C.

A pressure within the reaction chamber can be less than 760 Torr, for example 400 Torr, 100 Torr, 50 Torr or 20 Torr, 5 Torr, Torr or 0.1 Torr. Different pressure may be used for different process steps.

Transition metal precursor is provided in the reaction chamber containing the substrate 104. Without limiting the current disclosure to any specific theory, transition metal precursor may chemisorb on the substrate during providing transition metal precursor in the reaction chamber. The duration of providing transition metal precursor in the reaction chamber (transition metal precursor pulse time) may be, for example, 0.01 s, 0.5 s, 1 s, 1.5 s, 2 s, 2.5 s, 3 s, 3.5 s, 4 s, 4.5 s or 5 s. In some embodiments, the duration of providing transition metal precursor in the reaction chamber (transition metal precursor pulse time) is may be more than 5 s or more than 10 s or about 20 s.

When halogen precursor is provided in the reaction chamber 106, it may react with the chemisorbed transition metal precursor, or its derivate species, to form a material comprising transition metal and halogen. The duration of providing halogen precursor in the reaction chamber (halogen precursor pulse time) may be, for example, 0.5 s, 1 s, 2 s, 3 s, 3.5 s, 4 s, 5 s, 6 s, 7 s, 8 s, 10 s, 12 s, 15 s, 30 s, 40 s, 50 s or 60 s. In some embodiments, the duration of providing halogen precursor in the reaction chamber is be less than 15 s or less than 10 s or about 3 s.

In some embodiments, transition metal precursor may be heated before providing it into the reaction chamber. In some embodiments, the halogen precursor may be heated before providing it to the reaction chamber. In some embodiments, the halogen precursor may kept in ambient temperature before providing it to the reaction chamber.

Steps 104 and 106, performed in any order, may form a deposition cycle, resulting in the deposition of a material comprising transition metal and halogen. In some embodiments, the two steps of the deposition, namely providing the transition metal precursor and the halogen precursor in the reaction chamber (104 and 106), may be repeated (loop 108). Such embodiments contain several deposition cycles. The thickness of the deposited material may be regulating by adjusting the number of deposition cycles. The deposition cycle (loop 108) may be repeated until a desired material thickness is achieved. For example about 50, 100, 150, 200, 250, 300, 400, 500, 600, 700, 800, 1,200 or 1,500 deposition cycles may be performed.

The amount of transition metal deposited during one cycle (growth per cycle) varies depending on the process conditions, and may be, for example from about 0.1 Å/cycle to about 10 Å/cycle, like from about 0.3 Å/cycle to about 4.5 Å/cycle, such as from about 0.5 Å/cycle to about 3.5 Å/cycle or from about 1.2 Å/cycle to about 3.0 Å/cycle. For example, the growth rate may be about 1.0 Å/cycle, 1.2 Å/cycle, 1.4. Å/cycle, 1.6 Å/cycle, 1.8 Å/cycle, 2 Å/cycle, 2.2 Å/cycle, 2.4 Å/cycle. Depending on the deposition conditions, deposition cycle numbers etc., material of variable thickness may be deposited. For example, a material may have a thickness between approximately 0.2 nm and 60 nm, or between about 1 nm and 50 nm, or between about 0.5 nm and 25 nm, or between about 1 nm and 50 nm, or between about 10 nm and 60 nm. A material may have a thickness of, for example, approximately 0.2 nm, 0.3 nm, 0.5 nm, 1 nm, 1.5 nm, 2 nm, 2.5 nm, 3 nm, 3.5 nm, 4 nm, 4.5 nm, 5 nm, 6 nm, 8 nm, 10 nm, 15 nm, 20 nm, 25 nm, 30 nm, 35 nm, 40 nm, 50 nm, 70 nm, 85 nm or 100 nm. The desired thickness may be selected according to the application in question.

Transition metal precursor and halogen precursor may be provided in the reaction chamber in separate steps (104 and 106). FIG. 1B illustrates an embodiment according to the current disclosure, where steps 104 and 106 are separated by purge steps 105 and 107. In such embodiments, a deposition cycle comprises one or more purge steps 105, 107. During purge steps, precursors can be temporally separated from each other by inert gases, such as argon (Ar), nitrogen (N$_2$) or helium (He) and/or a vacuum pressure. The separation of transition metal precursor and halogen precursor may alternatively be spatial.

Purging the reaction chamber 103, 105 may prevent or mitigate gas-phase reactions between a transition metal precursor and a halogen precursor, and enable possible self-saturating surface reactions. Surplus chemicals and reaction byproducts, if any, may be removed from the substrate surface, such as by purging the reaction chamber or by moving the substrate, before the substrate is contacted with the next reactive chemical. In some embodiments, however, the substrate may be moved to separately contact a transition metal precursor and a halogen precursor. Because in some embodiments, the reactions may self-saturate, strict temperature control of the substrates and precise dosage control of the precursors may not be required. However, the substrate temperature is preferably such that an incident gas species does not condense into monolayers or multimonolayers nor thermally decompose on the surface.

When performing the method 100, a material comprising transition metal is deposited onto the substrate. The deposition process may be a cyclical deposition process, and may include cyclical CVD, ALD, or a hybrid cyclical CVD/ALD process. For example, in some embodiments, the growth rate of a particular ALD process may be low compared with a CVD process. One approach to increase the growth rate may be that of operating at a higher deposition temperature than that typically employed in an ALD process, resulting in some portion of a chemical vapor deposition process, but still taking advantage of the sequential introduction of a transition metal precursor and a halogen precursor. Such a process may be referred to as cyclical CVD. In some embodiments, a cyclical CVD process may comprise the introduction of two or more precursors into the reaction chamber, wherein there may be a time period of overlap between the two or more precursors in the reaction chamber resulting in both an ALD component of the deposition and a CVD component of the deposition. This is referred to as a hybrid process. In accordance with further examples, a cyclical deposition process may comprise the continuous flow of one reactant or precursor and the periodic pulsing of the other chemical component into the reaction chamber. The temperature and/or pressure within a reaction chamber during step 104 can be the same or similar to any of the pressures and temperatures noted above in connection with step 102.

In some embodiments, the transition metal precursor is brought into contact with a substrate surface 104, excess transition metal precursor is partially or substantially completely removed by an inert gas or vacuum 105, and halogen precursor is brought into contact with the substrate surface comprising transition metal precursor. Transition metal precursor may be brought in to contact with the substrate surface in one or more pulses 104. In other words, pulsing of the transition metal precursor 104 may be repeated. The transition metal precursor on the substrate surface may react with the halogen precursor to form a material comprising transition metal on the substrate surface. Also pulsing of the halogen precursor 106 may be repeated. In some embodiments, halogen precursor may be provided in the reaction chamber first 106. Thereafter, the reaction chamber may be purged 105 and transition metal precursor provided in the reaction chamber in one or more pulses 104.

For example, if a film comprising transition metal is deposited at a temperature of between 270 to 310° C., and the deposition cycle (providing transition metal precursor and halogen precursor, separated by purging) is repeated between 100 and 200 times, it may be possible to obtain a material with a thickness between approximately 10 nm and 40 nm, for example 20 nm or 30 nm.

The properties of a film may be modified by using a post-deposition anneal. Annealing may be performed directly after depositing of a material, i.e. without additional layers being deposited. Alternatively, annealing may be performed after additional layers have been deposited. Material may be capped before annealing. A capping layer may comprise, consist essentially of, or consist of silicon nitride. An annealing temperature from about 320° C. to about 470° C. could be used. For example, an annealing temperature may be 330° C., 350° C., 380° C., 400° C., 430° C. or 450° C. Annealing may be performed in a gas atmosphere comprising, consisting essentially of, or consisting of argon, argon-hydrogen mixture, hydrogen, nitrogen or nitrogen-hydrogen mixture. Duration of annealing may be from about 1 minute to about 60 minutes, for example 5 minutes, 20 minutes, 30 minutes or 45 minutes. An annealing may be performed at a pressure of 0.05 to 760 Torr. For example, a pressure during annealing may be about 1 Torr, about 10 Torr, about 100 Torr or about 500 Torr.

FIG. 2 illustrates an exemplary structure, or a portion of a device 200 in accordance with the disclosure. Portion of a device or structure 200 includes a substrate 202, a material layer comprising a transition metal 204, and an optional underlayer 206 in between (e.g., in contact with one or both) substrate 202 and material layer comprising a transition metal 204. Substrate 202 can be or include any of the substrate material described herein, such as a dielectric or insulating layer. By way of example, dielectric or insulating layer can be high-k material, such as, for example, a metallic oxide. In some embodiments, the high-k material has a dielectric constant higher than the dielectric constant of silicon oxide. Exemplary high-k materials include one or more of hafnium oxide ($HfO_2$), tantalum oxide ($Ta_2O_5$), zirconium oxide ($ZrO_2$), titanium oxide ($TiO_2$), hafnium silicate (HfSiOx), aluminum oxide ($Al_2O_3$), lanthanum oxide ($La_2O_3$), titanium nitride, and mixtures/laminates comprising one or more such layers. Alternatively, substrate material may comprise metal.

Material layer comprising a transition metal 204 can be formed according to a method described herein. In embodiments, in which an underlayer 206 is formed, the underlayer may be formed using a cyclical deposition process. In some embodiments, a material layer comprising a transition metal may be deposited directly on the substrate. In such embodiments, there is no underlayer. As a further alternative, the structure or a device according to the current disclosure may comprise additional layers between substrate and material layer comprising transition metal.

FIG. 3 illustrates a deposition assembly 300 according to the current disclosure in a schematic manner. Deposition assembly 300 can be used to perform a method as described herein and/or to form a structure or a device, or a portion thereof as described herein.

In the illustrated example, deposition assembly 300 includes one or more reaction chambers 302, a precursor injector system 301, a transition metal precursor vessel 304, halogen precursor vessel 306, a purge gas source 308, an exhaust source 310, and a controller 312.

Reaction chamber 302 can include any suitable reaction chamber, such as an ALD or CVD reaction chamber.

The transition metal precursor vessel 304 can include a vessel and one or more transition metal precursors as described herein— alone or mixed with one or more carrier (e.g., inert) gases. Halogen precursor vessel 306 can include a vessel and one or more halogen precursors as described herein— alone or mixed with one or more carrier gases. Purge gas source 308 can include one or more inert gases as described herein. Although illustrated with three source vessels 304-308, deposition assembly 300 can include any suitable number of source vessels. Source vessels 304-308 can be coupled to reaction chamber 302 via lines 314-318, which can each include flow controllers, valves, heaters, and the like. In some embodiments, the transition metal precursor in the transition metal precursor vessel may be heated. In some embodiments, the vessel is heated so that the transition metal precursor reaches a temperature between about 60° C. and about 160° C., such as between about 100° C. and about 145° C., for example 85° C., 100° C., 110° C., 120° C., 130° C. or 140° C.

Exhaust source 310 can include one or more vacuum pumps.

Controller 312 includes electronic circuitry and software to selectively operate valves, manifolds, heaters, pumps and other components included in the deposition assembly 300. Such circuitry and components operate to introduce precursors and purge gases from the respective sources 304-308. Controller 312 can control timing of gas pulse sequences, temperature of the substrate and/or reaction chamber 302, pressure within the reaction chamber 302, and various other operations to provide proper operation of the deposition assembly 300. Controller 312 can include control software to electrically or pneumatically control valves to control flow of precursors and purge gases into and out of the reaction chamber 302. Controller 312 can include modules such as a software or hardware component, which performs certain tasks. A module may be configured to reside on the addressable storage medium of the control system and be configured to execute one or more processes.

Other configurations of deposition assembly 300 are possible, including different numbers and kinds of precursor and reactant sources and purge gas sources. Further, it will be appreciated that there are many arrangements of valves, conduits, precursor sources, and purge gas sources that may be used to accomplish the goal of selectively and in coordinated manner feeding gases into reaction chamber 302. Further, as a schematic representation of a deposition assembly, many components have been omitted for simplicity of illustration, and such components may include, for example, various valves, manifolds, purifiers, heaters, containers, vents, and/or bypasses.

During operation of deposition assembly 300, substrates, such as semiconductor wafers (not illustrated), are transferred from, e.g., a substrate handling system to reaction chamber 302. Once substrate(s) are transferred to reaction chamber 302, one or more gases from gas sources 304-308, such as precursors, reactants, carrier gases, and/or purge gases, are introduced into reaction chamber 302.

The invention claimed is:

1. A method for forming a film comprising elemental transition metal on a substrate by a cyclic deposition process, the method comprising:
   providing a substrate in a reactor chamber; and,
   executing a cyclical deposition process, the cyclical deposition process comprising the steps of:
      providing a transition metal precursor in vapor phase into the reaction chamber; and
      providing a halogen precursor in vapor phase into the reaction chamber;
   to form a film comprising elemental transition metal on the substrate, wherein the halogen precursor comprises only one halogen atom.

2. The method according to claim 1, wherein the halogen precursor comprises halobenzene.

3. The method according to claim 1, wherein the halogen precursor comprises a compound consisting of a halogen atom and a hydrocarbon group.

4. The method according to claim 3, wherein the hydrocarbon group comprises an alkyl group that comprises a carbon chain of 2 to 8 carbons.

5. The method according to claim 3, wherein the hydrocarbon group comprises an aryl group.

6. The method according to claim 1, wherein the halogen atom is iodine or bromine.

7. The method according to claim 1, wherein the halogen precursor comprises iodobenzene or 1-iodobutane.

8. The method according to claim 1, wherein the halogen precursor comprises bromobenzene or 1-bromobutane.

9. The method according to claim 1, wherein the transition metal of the transition metal precursor is selected from the group V-VI transition metals.

10. The method according to claim 1, wherein the transition metal of the transition metal precursor is selected from the group VI transition metals.

11. The method according to claim 1, wherein the transition metal of the transition metal precursor is selected from the group consisting of chromium, molybdenum, tungsten, vanadium, tantalum, and niobium.

12. The method according to claim 1, wherein the transition metal precursor comprises a metal-organic precursor or an organometallic precursor.

13. The method according to claim 12, wherein the transition metal precursor comprises a benzene or a cyclopentadienyl group.

14. The method according to claim 1, wherein the transition metal precursor comprises a hydrocarbon ligand and an additional ligand.

15. The method according to claim 1, wherein the transition metal precursor comprises a transition metal atom and at least one aryl group ligand bonded to the metal atom.

16. The method according to claim 1, wherein the transition metal precursor comprises a transition metal atom and a bis-arene ligand bonded to the metal atom.

17. The method according to claim 1, wherein the transition metal precursor comprises $Mo(EtBz)_2$.

18. The method according to claim 1, wherein the transition metal precursor and the halogen precursor are supplied in pulses and the reaction chamber is purged between consecutive pulses of the two precursors.

19. The method according to claim 1, wherein the transition metal precursor comprises a transition metal atom and at least one alkyl-arene ligand bonded to the metal atom, and wherein the halogen atom of the halogen precursor is an iodine atom.

* * * * *